United States Patent [19]
Wuyts

[11] Patent Number: 5,924,192
[45] Date of Patent: *Jul. 20, 1999

[54] METHOD AND DEVICE FOR FITTING ELECTRONIC COMPONENTS IN A PRINTED CIRCUIT BOARD

[75] Inventor: Robert A. Wuyts, Antwerp, Belgium

[73] Assignee: Framatome Connectors International, Courbevoie, France

[ * ] Notice: This patent issued on a continued prosecution application filed under 37 CFR 1.53(d), and is subject to the twenty year patent term provisions of 35 U.S.C. 154(a)(2).

[21] Appl. No.: 08/739,958

[22] Filed: Oct. 30, 1996

[30] Foreign Application Priority Data

Nov. 6, 1995 [BE] Belgium ................................ 95/00914

[51] Int. Cl.⁶ ............................. H05K 3/30; H05K 13/08
[52] U.S. Cl. ................................ 29/833; 29/721; 29/740; 29/741; 29/837
[58] Field of Search .............................. 29/720, 721, 741, 29/740, 833, 834, 836, 837; 356/375

[56] References Cited

U.S. PATENT DOCUMENTS

| | | |
|---|---|---|
| 4,598,456 | 7/1986 | McConnell ................................ 29/407 |
| 5,084,959 | 2/1992 | Ando et al. ............................ 29/720 X |
| 5,115,559 | 5/1992 | Oyama ....................................... 29/720 |
| 5,172,468 | 12/1992 | Tanaka et al. ............................. 29/721 |
| 5,206,985 | 5/1993 | Tsukihashi et al. ....................... 29/720 |
| 5,420,691 | 5/1995 | Kawaguchi ............................ 29/721 X |
| 5,456,001 | 10/1995 | Mori et al. ............................. 29/740 X |

FOREIGN PATENT DOCUMENTS 39 21 052 A1  1/1990  Germany .

*Primary Examiner*—Peter Vo
*Attorney, Agent, or Firm*—Perman & Green, LLP

[57] ABSTRACT

The electronic components, provided with a series of contact pins, are picked up out of a feed unit (50) by a pickup-and-insertion head (20) which travels along the Y axis to above a table (12) on which is mounted the printed circuit board, and which can travel along the X axis. The series of contact pins are pushed into the corresponding holes in the board after a visual inspection of the position of the contact pins and holes has been carried out. This visual inspection is carried out by a camera (70) which is fixed-mounted between the feed unit and the table (12), and by a camera (80) which is mounted in the vicinity of the head (20) and which can travel with said head.

12 Claims, 2 Drawing Sheets

METHOD AND DEVICE FOR FITTING ELECTRONIC COMPONENTS IN A PRINTED CIRCUIT BOARD

BACKGROUND OF THE INVENTION

This invention concerns a method and a device for fitting electronic components and others, more particularly for fitting connectors of the "press-fit" type in a printed circuit board, hereinafter referred to as "PCB".

Said press-fit connectors comprise a connector body in which a series of contact pins are fitted which project from the side or the bottom of the body.

The PCB is a relatively thin board of insulated material provided with a number of openings or holes which may or may not be connected with each other by means of a conducting material printed on the board.

The thickness of the PCB is not limited by the device, but by the characteristics of the connectors used.

Both the method and the device are suitable for handling male and female connectors, both in the straight and 90° versions.

Until now, these connectors were mostly fitted to the PCB manually, so that the efficiency and quality of the connections made could not always be assured under optimum conditions. Furthermore, said operations demand a considerable amount of skill and precision, and also involve exposure to dangerous operations, including pressing in the connectors under a heavy press.

Devices already exist which automatically take electronic components from a feed channel and press them into a PCB.

For example, there are devices fitted with a rotating head, with gripper arms that pick up components one after another and push them into a PCB. Such devices are known from among others Belgian patent BE 903,742 in the name of the applicant, and from German patent DE 3,424,323.

These devices are however only suitable for inserting simple contact pins or small electronic components in a PCB; they are insufficient for pressing in several contact pins at once, as is necessary for connectors which are already fitted with the required contact pins, since it is necessary to provide an insertion force of from 6 to 20 kg per contact pin, so that connectors which can have 200 or more contact pins require a pressure of around four tons.

Further, in order to insert a series of contact pins for a connector, it is necessary to ensure that the ends of the contact pins are all exactly in line with each other, in order to prevent the pins being damaged when they are inserted into the corresponding holes in the PCB.

U.S. Pat. No. 4,718,165 describes a device equipped with a pickup head for picking up connectors and inserting them with their contact pins into the corresponding holes of a PCB. Said device has a means in the form of a double comb which correctly aligns the contact pins before they are inserted into the PCB. The device according to said invention is provided with means for picking up, aligning and inserting contact pins of a single type (long) of connector. Furthermore, the means for aligning the contacts are mechanically complicated and time-consuming, so that a continuous movement of the various operations is not possible.

SUMMARY OF THE INVENTION

The aim of the present invention is to ensure fully automatic and continuous insertion of press-fit connectors in a PCB, where the correct insertion of the different contact pins in the corresponding holes of the PCB is ensured by a visual inspection, followed by correction of the position of the pins with respect to the holes.

A second aim of the invention is to propose a device that makes it possible to pick up a great number of different types of connectors from their respective feed channels and insert them selectively into the PCB.

A third aim of the invention is to considerably increase the operating speed and reliability of the above-mentioned operations.

In order to achieve these aims, the method and the device according to the invention are characterised by operations and means which are further explained in the claims that follow the description.

BRIEF DESCRIPTION OF THE DRAWINGS

In order to better explain the invention and further characteristics thereof, a particular embodiment is described below, with reference to the attached drawings, where.

DETAILED DESCRIPTION OF THE DRAWINGS

Figure 1:
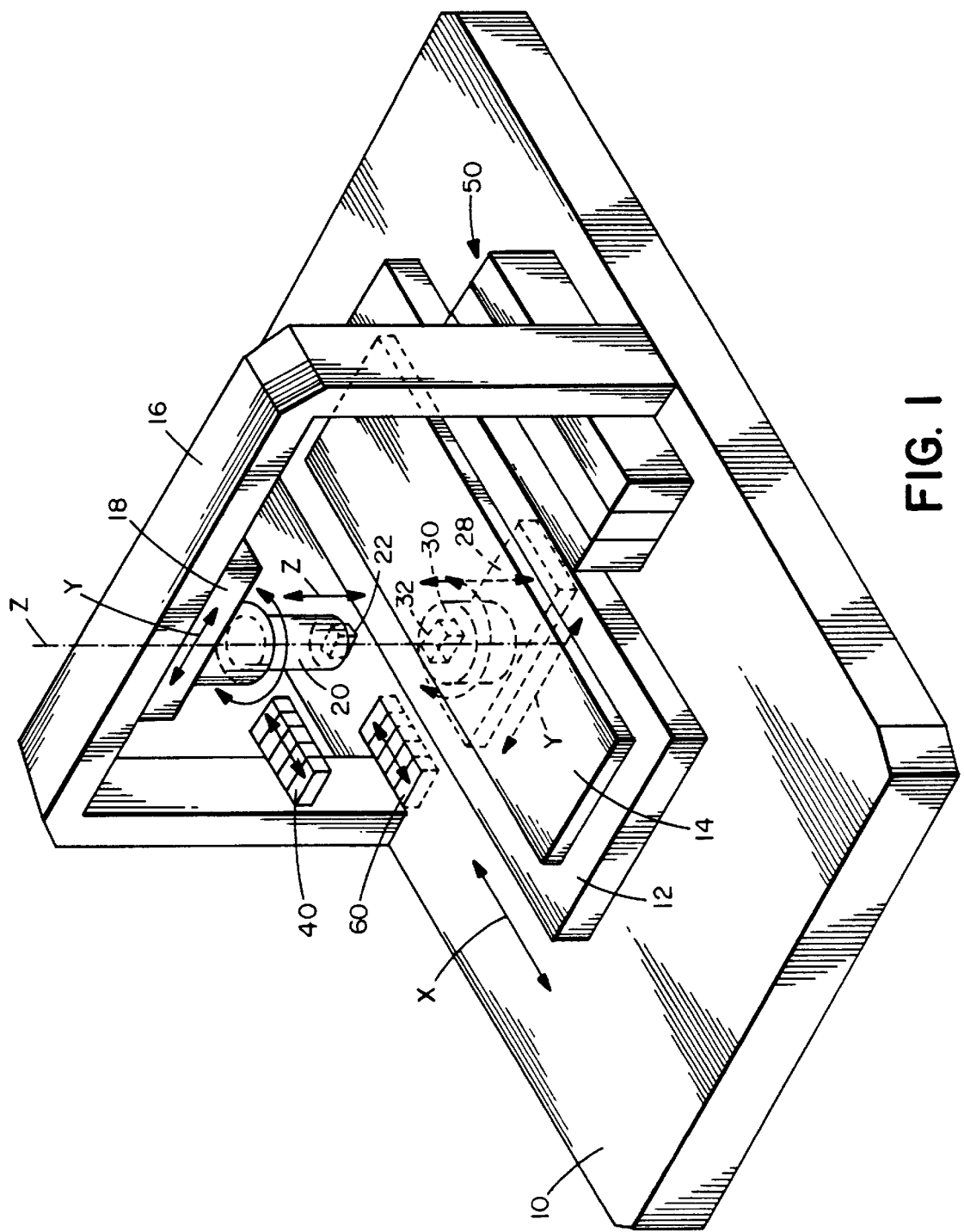
FIG. 1 is a schematic representation of the arrangement and movements of the main components of the device.

The main components of the invention are shown schematically in FIG. 1 and comprise a fixed base 10, with a centrally arranged table 12 on which one or more PCBs 14 are fixed. The table 12 can travel along an X axis transversely underneath a gantry 16 whose vertical pillars are attached at the bottom to the fixed base 10.

A gantry arrangement has been chosen because of the accuracy and stability of the whole. The pantry 16 and the base 10 are preferably made of granite.

With a portal arrangement, the accuracy is under better control than with an X-Y table. A gantry enables picking up and inserting to be done directly, and furthermore makes it possible for the device to be included in a production line with automatic input and output of components and finished products.

Under the cross-beam of the gantry 16 is fitted a slide 18 which can travel along a Y axis, and which therefore travels transversely over the table 12 between the vertical pillars of the gantry 16.

The slide 18 is fitted with a pickup-and-insertion head 20 which can move up and down along the Z axis, which can also carry out a rotational movement.

A gripper mechanism 22 arranged underneath the head 20 can thus move with respect to the PCB 14 as follows: transversely across the PCB, up and down, and in rotation.

Underneath the PCB is a support mechanism in the form of an anvil 30 which is also mounted on a slide 28 and which can travel along a Y axis like the head 20.

The anvil 30 can like the head 20 move up and down along a Z axis, and carry out a rotation motion.

The top side of the anvil 30 is provided with a receiving mechanism 32 which can move underneath the PCB as follows with respect to same: transversely underneath the PCB, up and down and in rotation.

In order to enable different types of connectors to be picked up and inserted into the PCB, the gripper mechanism 22 of the head 20, and the receiving mechanism 32 of the anvil 30, are respectively equipped with means for automatically picking up suitable tools from the respective magazines 40 and 60, where said tools make it possible to pick up each specific connector from one of the feed channels 50 in order to insert it into the PCB, with the PCB being supported by a suitable tool on the anvil 30.

For each type of connector, the device requires a toolset.

Said toolset comprises a bottom tool for the anvil 30 and a top tool for the pickup-and-insertion head 20.

The different top tools for the head 20 are located in a magazine 40 mounted on one side of the gantry 16, above the level of the table 12.

The various corresponding tools for the anvil 30 are located in a magazine 60 mounted on the same side as the magazine 40 but underneath the level of the table 12.

Both tool magazines 40 and 60 are moveably mounted so that they can travel along an X axis, i.e. transversely with respect to the Y axis of the head 20 and the anvil 30.

Each of the tools which can be located in the magazines 40 and 60 can thus be presented straight opposite the gripper mechanism 22 of the head 20 and the receiving mechanism 32 of the anvil 30 respectively.

Once an appropriate top tool has been taken out of the magazine 40 by the mechanism 22 of the head 20, and a corresponding bottom mechanism has been picked up by the mechanism 32 of the anvil 30, the slide 18 of the head 20 can travel along the Y axis to the other side of the gantry 16 where a series of feed channels 50 or analogue are mounted, and from which the appropriate connector can be picked up and held fast by the head 20.

In the meantime, the bottom tool of the anvil 30 positions itself underneath the holes in the PCB into which the pins of the elected connector are to be inserted.

As a result of the rotation movement of the head 20 and of the anvil 30 respectively, a connector can be picked out of a feed channel 50 lying in a direction along the X axis, and can then be rotated and subsequently inserted into the PCB along the Y axis, where said PCB is supported by the bottom tool of the anvil 30, which has also rotated for this purpose.

The tool change is carried out automatically, according to the PCB component mounting program (computer program) stored in the control unit of the device, which is not further described here.

According to the invention, during the movement of the head 20, with the connector that has been picked up, between feed channel 50 and the PCB 14, a visual inspection is carried out of the position of the contact pins of the connector that has been picked up, and of the position of the holes in the PCB into which the pins have to be inserted.

Figure 2:
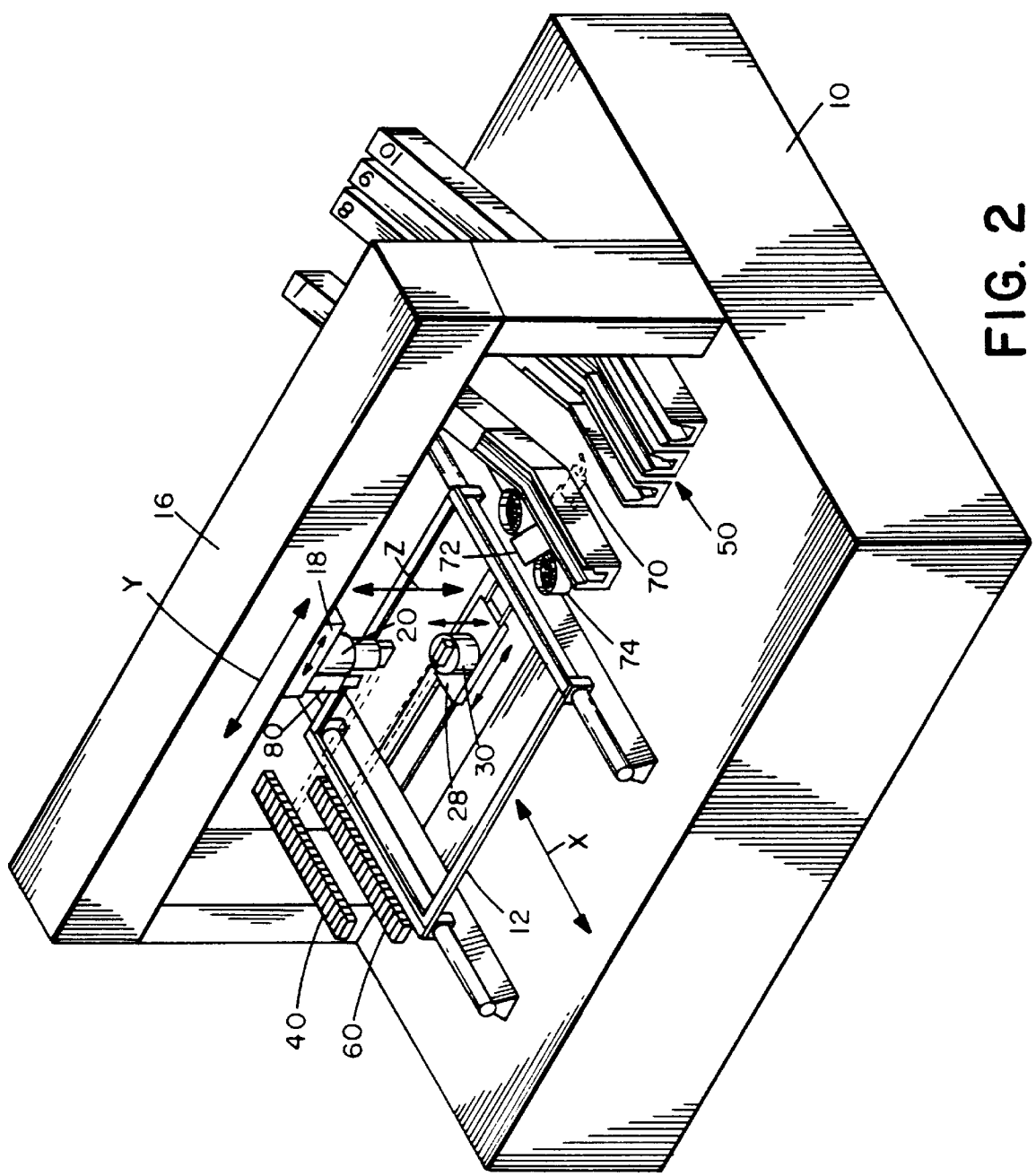
FIG. 2 is a perspective view of a device fitted according to the invention with the means for visual inspection.

FIG. 2 shows the arrangement of the means which enable this visual inspection to be carried out. Said means can be e.g. cameras.

A fixed camera 70 is mounted between the feed channels 50 and the table 12 (PCB). Each connector that is picked up is moved above the camera 70 by means of the pickup head 20, so that an image of the underneath of the connector is registered by the optical axis of said camera 70, this is directly or via a mirror 72.

The necessary light is provided by lamps 74, of the halogen lamp or light-emitting diode type, which preferably emit a diffuse light.

The focus plane of the camera 70 is fixed, and the focus field of the camera must therefore be adjusted by an up-and-down movement (along the Z axis) of the pickup-and-insertion head 20.

The camera 70 is preferably of the asynchronous shutter array CCD type, with which still images can be made of the underneath of the moving connector (with the contact pins sticking out).

The position of the contact pins and/or connector housing with respect to the centre of the insertion axis is determined from the image or series of images.

A second camera 80 is mounted on the slide 18 of the pickup-and-insertion head 20, where said second camera 80 is preferably a normal array CCD type, which can visualise the position of the corresponding holes in the PCB.

By means of the slide 18, the camera 80 can be positioned transversely over the PCB. The optical axis of the camera 80 is displaced by a known distance along the X and Y axis with respect to the axis of the head 20.

The camera 80 is placed above a hole in the PCB in a position where the hole should actually be, without taking finishing tolerances into account. The centre of the hole is calculated from the actual camera position.

By carrying out several measurements for each PCB, the actual positions of the drill pattern can be found (measured).

Since the camera 80 is mounted on the slide 18, it must be fitted with self-adjusting focus, so that the image can be focused on the holes or on already mounted components or connectors.

During the transport or the flight of the connector from the one feed channel 50 to a mounting position above the PCB, the images of the two cameras 70 and 80 are superimposed and compared, so that an XY correction can be carried out, such that the connector contact pins can be positioned in the centres of the corresponding holes with as close an average approximation as possible. If according to the images no successful component mounting is possible, the connector is rejected.

As an extra safety check, the pickup-and-insertion head 20 can, as already known from similar devices, be fitted with a force measuring unit whose output signal is proportional to the insertion force. For each type of connector, an ideal force diagram is stored in the control unit (computer). For each component mounting operation, the actual force curve is measured and compared with the normal diagram. If the difference from the force exerted is "too large" or "too small", the machine is stopped.

It should be obvious that the method and the device according to the present invention also can be operated in "inverse" mode, which means that the camera 80 also can carry out the visual inspection of the position of terminals of an already installed connector and that camera 70 looks for the position of the holes in a connector shroud to be placed on pins of an already installed first connector.

The most important advantages associated with the device according to the invention are:

great reliability of the finished PCBs;

high reliability of the component mounting of the PCB, even for differing types of connectors;

great flexibility of applications: handling several PCBs at once, fitting connectors with straight downwards or sideways contact pins, or pins at 90°;

ability to insert press-fit connectors with more than 150 contact pins at once;

simple mechanical construction and efficient arrangement of the moving parts (table, pickup-and-insertion head, and anvil).

I claim:

1. A method for fitting one electronic component into another component (14), the one electronic component being of the type provided with a series of contact pins and the other electronic component having a plurality of holes corresponding in position with said series of contact pins of said one electronic component and said plurality of holes each having a center, and where a pickup-and-insertion head (20) carried by a slide, which slide travels only in one direction (Y) in a given plane between a feed unit (50) for the one electronic component and a table (12) disposed for movement therebelow in another plane extending parallel to said given plane, said table travelling in another orthogonally disposed direction (X) and on which the other component (14) is mounted, said method comprising the steps of causing the pickup-and-insertion head (20) to pick up one electronic component from said feed unit and moving said picked up one electronic component between said feed unit and the table and during said movement of said pickup-and-insertion head between said feed unit and said table, optically inspecting by electronic means the picked up one component to establish a first image while being moved by said pickup and insertion head between said feed unit and said table and determining the position of the pins thereon relative to a given reference position using said first image, using said first image to compare the position of said pins relative to said given reference position and said position of said holes relative to another reference position while the picked up one component is moved between said feed unit and said table, and inserting said one electronic component into said another component when said first image corresponds to the positions of said corresponding holes in said other component.

2. The method according to claim 1, wherein the step of optically inspecting includes carrying out an optical inspection of the position of at least one hole in the another component (14) to obtain a second image of the position of at least one hole of said plurality of openings in said other electronic component relative to said another given reference position, superimposing the first and second images in order to compare said images with one another, and applying a correction in either of said one and another directions to one of said pickup-and-insertion head and said table, respectively, if said first and second images do not match in order to position the contact pins of the one component in the center of the corresponding holes in the other component (14).

3. A device for fitting electronic components provided with a series of contact pins, in a printed circuit board (14) having holes corresponding in position with said series of contact pins of said electronic components, comprising: a feed unit for electronic components, a base (10) on which is mounted a table (12) travelling only in a first direction (X) within a first given plane, and a pickup-and-insertion head (20) for picking up a component from said feed unit and carried by a slide movable only in a second direction (Y) through a second given plane extending parallel to said first given plane above the table (12) perpendicular to the first direction and between the feed unit (50) for components and the table (12) on which the board (14) is mounted, wherein the device includes a visual inspection means located between the feed unit (50) and the table (12), for making a first image of the position relative to a reference position of the contact pins of the electronic component that has been picked up by said pickup-and insert head, and means for establishing a second image of the position of the holes in said printed circuit board relative to another reference position and means for causing a comparison between the position of said pins relative to the one reference position as embodied in said first image and the position of said holes relative to the another reference position as embodied in said second image during movement of said electronic component picked up by said pickup and insert head between said feed unit and said table whereby insertion of said electronic components into said circuit board occurs when said first image corresponds to the second image.

4. The device according to claim 3, wherein adjacent the pickup-and-insertion head (20), visual inspection means (80) are mounted which travel with the head (20) and positioned transversely over the board (14) to register a second image that determines the position of the holes in the board (14).

5. The device according to claim 4, wherein the visual inspection means (80) consist of a camera of the normal array CCD type, for of determining the position of holes in the board (14) or of the terminals in an already mounted component.

6. The device according to claim 3, wherein the pickup-and-insertion head (20) is mounted on a slide (18) which travels transversely above the table (12) and which is mounted underneath the cross-beam of a gantry (16) which is connected underneath by its vertical pillars to the fixed base (10).

7. The device according to claim 6, wherein the gantry is supported on a base (10) and the gantry (16) and the base are made of granite.

8. The device according to claim 3, wherein below the table (12) is a support mechanism in the form of an anvil (30), which is mounted on a slide (28) movable along a Y axis and which can also move up and down along the Z axis, in order to be able to support the board (14) while a series of contact pins are being pushed in.

9. The device according to claim 8, wherein the top side of the anvil (30) is fitted with a receiving mechanism (32) enabling each different type of electronic component, to receive a suitable tool from a magazine (60) mounted on the side of the gantry (16) situated opposite the feed unit (50), at a level higher than that of the table (12).

10. The device according to claim 3, wherein the pickup-and-insertion device (20) is fitted on the lower end thereof with a gripper mechanism (22) enabling pickup from a magazine of a suitable tool for each different type of electronic component, said magazine (40) mounted on the side of the gantry (16) opposite the feed unit (50), at a level higher than the table (12).

11. The device according to claim 3, wherein the visual inspection means (70) consist of a camera of the asynchronous shutter array CCD type, for making still images of the undersurface of a moving part having the projecting contact pins or holes.

12. The device according to claim 3 wherein the pickup-and-insertion head (20) is fitted with a force measuring device whose output signal is proportional to the force with which the contact pins are pressed into the board (14).

* * * * *